United States Patent [19]

Goldhammer

[11] Patent Number: 5,177,326
[45] Date of Patent: Jan. 5, 1993

[54] LEAD WIRE ARRAY FOR A LEADLESS CHIP CARRIER

[75] Inventor: Kurt R. Goldhammer, West Milford, N.J.

[73] Assignee: GEC-Marconi Electronic Systems Corp., Wayne, N.J.

[21] Appl. No.: 779,909

[22] Filed: Oct. 21, 1991

[51] Int. Cl.⁵ .................. H01L 23/02; H01R 9/00; H05K 3/00; H05K 3/30
[52] U.S. Cl. .................. 174/52.4; 29/829; 29/842; 29/832; 174/261; 361/404; 361/405; 361/406; 257/693
[58] Field of Search .............. 29/825, 829, 832, 842; 174/260, 261, 267, 52.4; 361/400, 401, 403, 404, 405, 406, 408, 409; 357/74

[56] References Cited

U.S. PATENT DOCUMENTS

| | | | |
|---|---|---|---|
| 3,689,684 | 9/1972 | Cox, Jr. et al. | 174/68.5 |
| 4,089,575 | 5/1978 | Grabbe | 174/52.4 |
| 4,647,126 | 3/1987 | Sobota, Jr. | 361/405 |
| 4,736,520 | 4/1988 | Morris | 29/827 |
| 4,991,666 | 2/1991 | Septfons et al. | 174/261 |
| 5,099,396 | 3/1992 | Barz et al. | 361/424 |

Primary Examiner—Leo P. Picard
Assistant Examiner—B. Lee Ledynh
Attorney, Agent, or Firm—David L. Davis

[57] ABSTRACT

A lead wire array for a leadless chip carrier which functions to mount and electrically interconnect a leadless chip carrier to a printed wiring board. The array is formed from a length of bare wire which is appropriately folded and bent to provide interconnections between the contact pads on the leadless chip carrier and contact pads on the printed wiring board, which are then separated by removing portions of the lead wire array after its attachment to the leadless chip carrier.

10 Claims, 4 Drawing Sheets

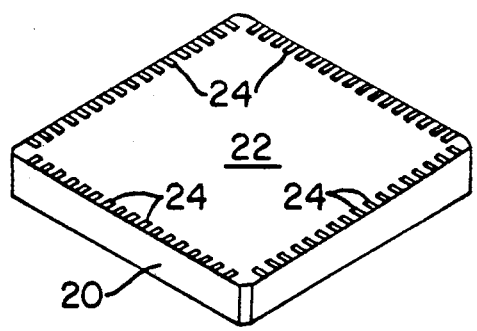
FIG. IA
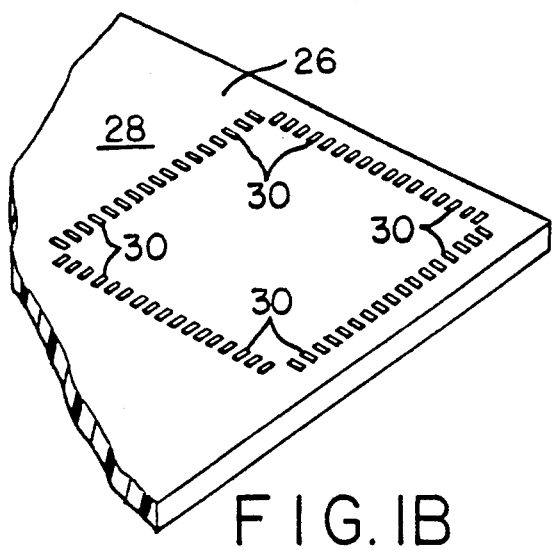
FIG. IB
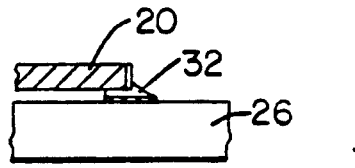
PRIOR ART
FIG. 2
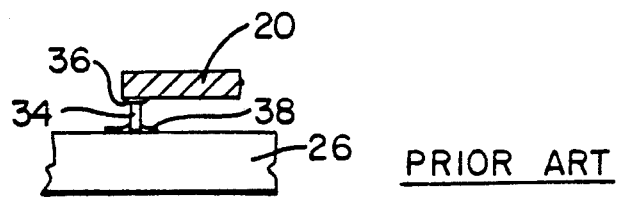
PRIOR ART
FIG. 3
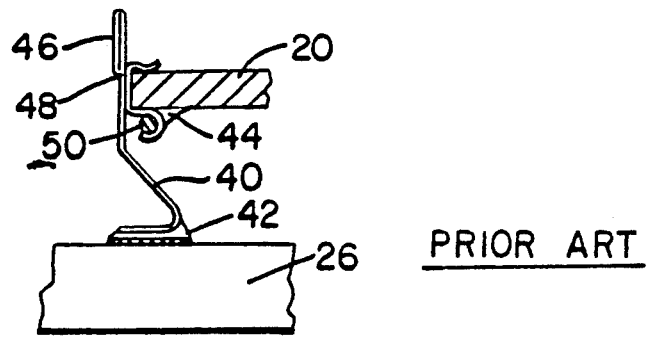
PRIOR ART
FIG. 4

LEAD WIRE ARRAY FOR A LEADLESS CHIP CARRIER

BACKGROUND OF THE INVENTION

This invention relates to an improvement in the surface mounting of a leadless chip carrier to a printed wiring board.

A leadless chip carrier is an integrated circuit package which includes a ceramic substrate on which there is provided a pattern of contact pads. A corresponding pattern of contact pads is provided on a printed wiring board. When the leadless chip carrier is mounted to the printed wiring board, the patterns of contact pads are electrically interconnected.

Various approaches to the mounting and electrical interconnection of a leadless chip carrier to a printed wiring board have been proposed and implemented in the past. All of the known approaches are disadvantageous for one or more reasons. One approach is to provide a connector socket for receiving the leadless chip carrier on the printed wiring board. This approach is relatively expensive. Another approach is to directly solder the contact pads of the leadless chip carrier to the contact pads of the printed wiring board. Since the leadless chip carrier has a ceramic substrate, it has a low coefficient of thermal expansion. Therefore, unless the coefficient of thermal expansion of the printed wiring board matches that of the leadless chip carrier, a reliability problem ensues. Printed wiring boards having a coefficient of thermal expansion matching that of the leadless chip carrier are available, but these are expensive.

Another mounting approach is the use of a Chip Carrier Mounting Device (a trademark of Raychem Corp.) which is an array of high temperature solder wire leads having an imbedded helical copper braid. This array is held in place by a dissolvable carrier which is temporary, the carrier being used to facilitate alignment of the wire leads to the contact pads of the leadless carrier. The carrier is removed after the leads are soldered to the leadless chip carrier. Disadvantages of this approach include the use of the temporary carrier which has a limited shelf life and is adversely affected by humidity. Additionally, limited stress relief is provided by the leads, which limits the size of the leadless chip carrier when implemented on standard printed wiring boards.

Another approach is the use of edge clips, which are created from metal stampings and are available on continuous reels. The edge clips are intended to clip onto the edge of the leadless chip carrier using a spring retention mechanism. Some disadvantages of edge clips are that they do not fit many leadless chip carrier packages and they are frequently difficult to assemble to leadless chip carriers. Additionally, the use of edge clips results in excessively high leadless chip carrier standoffs, which reduces packaging density.

It is therefore an object of the present invention to provide an approach for mounting and electrically interconnecting a leadless chip carrier to a printed wiring board which is economical and which does not possess the disadvantages of the approaches described above.

SUMMARY OF THE INVENTION

The foregoing, and additional, objects are attained in accordance with the principles of this invention by providing a lead wire array for mounting and electrically interconnecting a leadless chip carrier to a printed wiring board. The lead wire array comprises a length of bare wire formed into a planar serpentine shape having a plurality of parallel segments each connected by reversing segments at its ends to the next adjacent parallel segments on either side. The formed wire is then folded about a line orthogonal to the parallel segments so as to be in two substantially parallel and spaced apart planes with connecting segments therebetween. The parallel segments in the first plane are then attached to respective contact pads on the leadless chip carrier and the parallel segments in the second plane are attached to respective contact pads on the printed wiring board. The reversing segments are then removed so that individual contact pads on the leadless chip carrier are mounted and electrically connected to individual contact pads on the printed wiring board by portions of a respective parallel segment and a respective connecting segment.

In accordance with an aspect of this invention, there is provided a carrier board which holds the lead wire array prior to its attachment to the leadless chip carrier and the printed wiring board. The carrier board comprises a planar board and a plurality of posts secured to the planar board in locations corresponding to the relative positions of the reversing segments of the lead wire array. The posts are sized, shaped and located on the planar board so that the reversing segments can be wrapped around respective ones of the posts to removably secure the lead wire array to the carrier board for transportation and subsequent registration.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1A is a perspective view of a leadless chip carrier showing a typical pattern of contact pads;

FIG. 1B is a perspective view of a portion of a printed wiring board showing the corresponding pattern of contact pads;

FIG. 2 illustrates a prior art approach for directly soldering the contact pads of a leadless chip carrier to those of a printed wiring board;

FIG. 3 illustrates a prior art Chip Carrier Mounting Device for mounting a leadless chip carrier to a printed wiring board;

FIG. 4 illustrates a prior art edge clip for mounting a leadless chip carrier to a printed wiring board;

DETAILED DESCRIPTION

Figures 5A, 5B:
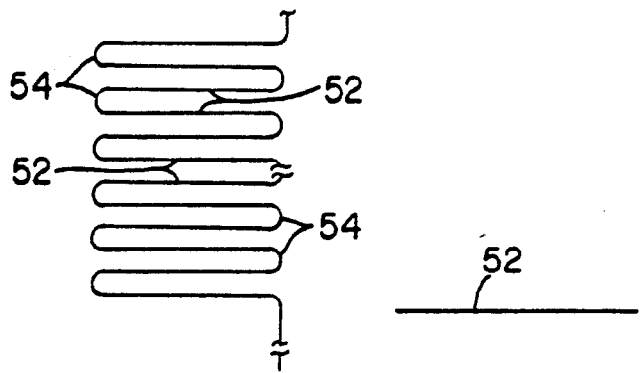
FIG. 5A is a top view illustrating a first step in forming a lead wire array according to this invention.
FIG. 5B is a side view thereof.

Referring now to the drawings, FIG. 1A shows a typical leadless chip carrier 20 which includes a ceramic substrate with a major surface 22. On the surface 22 is a pattern of contact pads 24 which typically extend along the edges of the surface 22. FIG. 1B shows a portion of a printed wiring board 26 to which the leadless chip carrier 20 is to be mounted. The printed wiring board 26 has a major surface 28 on which there is a pattern of contact pads 30 corresponding to the pattern of contact pads 24.

FIG. 2 illustrates the direct soldering of the contact pads 24 of the leadless chip carrier 20 to the contact pads 30 of the printed wiring board 26. Unless the printed wiring board 30 has a coefficient of thermal expansion which matches that of the ceramic carrier 20, the solder joint 32 is subject to failure. The reason for matching the coefficients of thermal expansion is to minimize stresses induced in the solder joint 32 which provides the electrical interconnection between the leadless chip carrier 20 and the printed wiring board 26. The approaches most commonly utilized for controlling the coefficient of thermal expansion of the printed wiring board 26 are to utilize thick film ceramic printed wiring boards, to utilize composite printed wiring boards having low coefficient of thermal expansion metal cores laminated within the printed wiring board structure or to utliize low coefficient of thermal expansion reinforcing fibers within the dielectric material making up the printed wiring board. However, the costs associated with these approaches can be prohibitive.

FIG. 3 illustrates a chip carrier mounting device 34 bonded to the contact pads 24 by a solder joint 36 and bonded to the contact pads 30 by a solder joint 38. As previously discussed, there are numerous disadvantages to this approach.

FIG. 4 illustrates an edge clip lead 40 connected by a solder joint 42 to the contact pads 30 and by a solder joint 44 to the contact pads 24. The edge clip lead 40 is attached to a carrier strip 46 which is frangible at 48 so that the carrier strip 46 may be snapped off after the soldering is performed. To assist in the soldering, the edge clip lead 40 may be provided with a solder preform 50 contained within a curved region of the clip lead 40. The disadvantages of this approach have been discussed above.

According to this invention, a lead wire array is advantageously provided which allows pre-leading of leadless chip carriers for subsequent solder assembly to a printed wiring board. The lead wire array is formed from a length of bare wire which is first bent into a planar serpentine shape, as shown in FIGS. 5A and 5B. This bending results in a plurality of parallel segments 52 each connected by reversing segments 54 at their ends to the next adjacent parallel segments on either side. The spacing of the parallel segments 52 corresponds to the spacing of the contact pads 24, 30. Illustratively, the reversing segments 54 are C-shaped, but other shapes, such as pointed V-shapes, are possible.

Figure 6A:
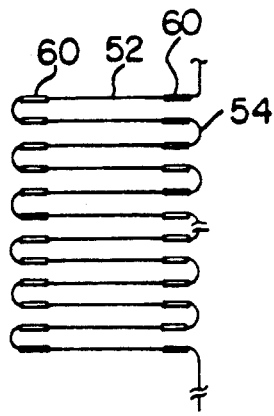
FIG. 6A is a top view illustrating a second step in the formation of a lead wire array according to this invention.
Figure 6B:
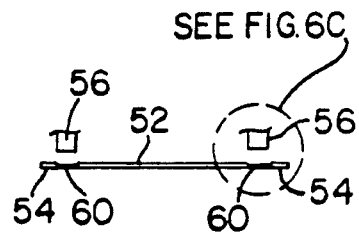
FIG. 6B is a side view thereof.
Figure 6C:
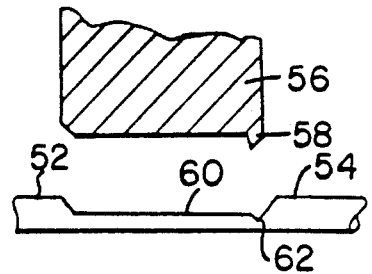
FIG. 6C is an enlarged detail of a portion of FIG. 6B.

The next step, as illustrated in FIGS. 6A, 6B and 6C is to flatten the portions of the parallel segments 52 which will eventually be soldered to the contact pads 24, 30. The reason for flattening the wire is to provide a greater surface area for the soldering step. This is accomplished by utilizing a coining tool 56. If desired, the coining tool 56 can have a sharp point 58 (FIG. 6C) so that the flattened portion 60 of the parallel segment 52 has a frangible region 62 adjacent the reversing segment 54 for a subsequent snap-off operation.

Figure 7A:
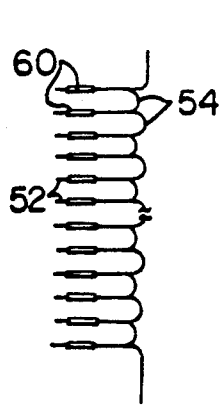
FIG. 7A is a top view illustrating a third step in the formation of a lead wire array according to a first embodiment of this invention.
Figures 7B, 8A:
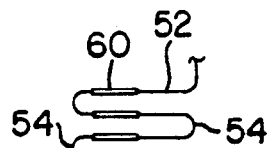
FIG. 7B is a side view thereof.
FIG. 8A is a top view illustrating a third step in the formation of a lead wire array according to a second embodiment of this invention.
Figure 8B:
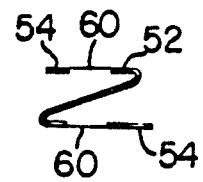
FIG. 8B is a side view thereof.
Figure 9A:
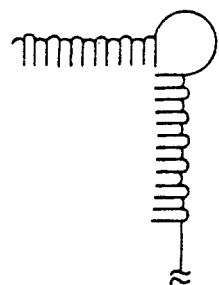
FIG. 9A is a top view illustrating a fourth step in the formation of a lead wire array according to a first embodiment of this invention.
Figure 9B:
FIG. 9B is a side view thereof.
Figure 10A:
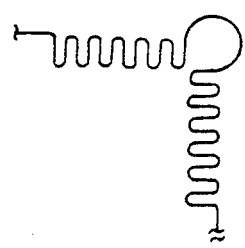
FIG. 10A is a top view illustrating a fourth step in the formation of a lead wire array according to a second embodiment of this invention.
Figure 10B:
FIG. 10B is a side view thereof.

As shown in FIGS. 7A, 7B, 8A and 8B, the next step is to fold the wire about a line orthogonal to the parallel segments 52 so that the flattened portions 60 are in either a first plane or a second plane. The first and second planes are substantially parallel to and spaced from each other. In a first embodiment, as shown in FIGS. 7A and 7B, the folding includes forming a C-shaped bend of the parallel segments 52, preferably about a mandrel 64. In this embodiment, all the reversing segments 54 extend in the same direction from the C-shaped bend. In a second embodiment, as illustrated in FIGS. 8A and 8B, the folding includes two oppositely directed bending steps to form a Z-shaped bend, wherein the reversing segments 54 extend in opposite directions.

As illustrated in FIGS. 9A, 9B, 10A and 10B, the foregoing steps are repeated for the second side of the leadless chip carrier 20. Although not shown, these steps are repeated twice more for the third and fourth sides of the leadless chip carrier 20.

Figure 11:
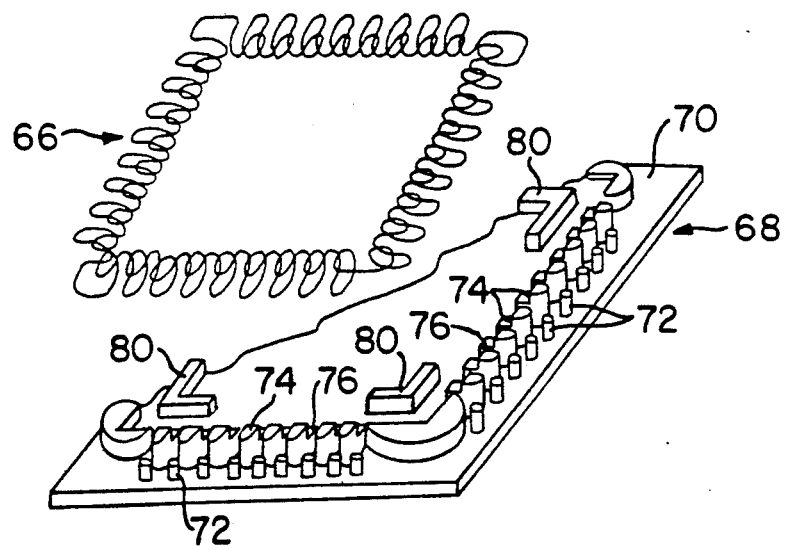
FIG. 11 illustrates a carrier board and a lead wire array according to this invention.
Figure 12:
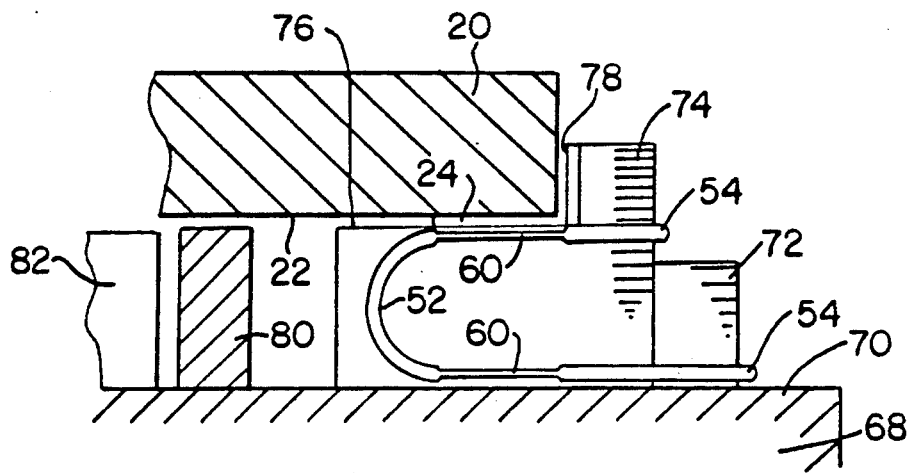
FIG. 12 illustrates the attachment of the first embodiment of a lead wire array according to this invention to a leadless chip carrier.

The resulting lead wire array 66 is shown in FIG. 11. To assist in transporting the lead wire array 66, and aligning it for attachment to the leadless chip carrier 20, there is provided a carrier board 68. The carrier board 68 includes a planar board 70 having secured thereto a first plurality of posts 72 and a second plurality of posts 74. The posts 72 and 74 are so sized, shaped and located on the planar board 70 that the lower reversing segments 54 can be placed around the posts 72 and the upper reversing segments 54 can be placed around the posts 74 (FIG. 12) in such a manner that the lead wire array 66 is removably secured to the carrier board 68. Thus, after its formation, the lead wire array 66 is easily transportable. In addition, the carrier board 68 functions to properly register the leadless chip carrier 20 with respect to the lead wire array 66 for its attachment thereto. To perform this function, the posts 74 are formed with a ledge, or abutment, 76 which is at the appropriate height so that when the major surface 22 of the leadless chip carrier 20 is placed thereon, the contact pads 24 engage the flattened portions 60. The posts 74 also have abutments 78 terminating the ledges 76 so that the four rows of abutments 78 from the four rows of posts 74 form an enclosure for the leadless chip carrier 20 which properly registers it with respect to the lead wire array 66.

The carrier board 60 may also be formed with members 80 which serve to align a heat sink 82 for its attachment to the leadless chip carrier 20. in a conventional manner.

Figure 13:
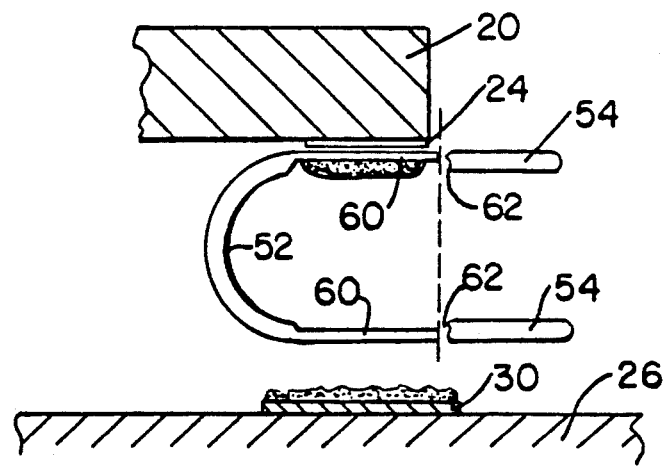
FIG. 13 illustrates the final steps in the mounting and electrically interconnection of a leadless chip carrier to a printed wiring board, according to a first embodiment of this invention.

FIG. 13 illustrates the final steps in the assembly of the leadless chip carrier 20 to the printed wiring board 26. After solder paste is applied to the contact pads 24 of the leadless chip carrier 20. the leadless chip carrier 20 is placed onto the carrier board 68 which aligns the contact pads 24 with the lead wire array 66. as described above. If desired. a heat sink is also appropriately registered. as described above. This assembly of the leadless chip carrier 20. the lead wire array 66. and the carrier board 68 is then placed into a reflow oven for solder attachment of the lead wire array 66 to the leadless chip carrier 20. After the assembly cools and is cleaned. the carrier board 68 is removed from the leadless chip carrier 20/lead wire array 66 assembly. The portion of the lead wire array 66 which extends beyond the outline of the leadless chip carrier 20 is then removed. This portion comprises the reversing segments 54. Such removal may be accomplished either by shearing or by snapping at the frangible region 62. After the unwanted reversing segments 54 have been removed. the now pre-leaded leadless chip carrier 20 may be located onto the printed wiring board 26 for final solder assembly.

There has thus been disclosed a simple. low cost technique for the formation of compliant high reliability leads for the pre-leading of a leadless chip carrier. This technique allows reliable mounting of high input/output count leadless chip carriers to standard printed wiring boards due to its small cross-section and bend configuration for maximum compliance with minimum length. It also allows reliable mounting of leadless chip carriers to standard printed wiring boards using small component stand-offs for maximum packaging density. The lead wire array can be provided with an integral heat sink/carrier to minimize assembly cost and can easily be adapted to fine pitch leadless devices having perimeter contact pads down to 25 mil center pitch.

Accordingly. there has been disclosed an improvement in the surface mounting of a leadless chip carrier to a printed wiring board. While a preferred embodiment of the present invention has been disclosed herein. it is understood that various modifications and adaptations to the disclosed arrangement will be apparent to those of ordinary skill in the art and it is only intended that this invention be limited by the scope of the appended claims.

I claim:

1. In combination:
   a lead wire array for mounting and electrically interconnecting a leadless chip carrier to a printed wiring board comprising a length of bare wire formed into a planar serpentine shape having a plurality of parallel segments each connected by reversing segments at its ends to the next adjacent parallel segments on either side and then folded about a line orthogonal to said parallel segments so as to be in two substantially parallel and spaced apart planes with connecting segments therebetween; and
   a carrier board for holding said lead wire array, said carrier board comprising:
   a planar board; and
   a plurality of posts secured to said planar board in locations corresponding to the relative positions of the reversing segments of the lead wire array. said posts being sized. shaped and located on the planar board so that the reversing segments can be wrapped around respective ones of the posts to removably secure the lead wire array to the carrier board.

2. The combination according to claim 1 wherein said posts are formed with abutments for the proper registration of the leadless chip carrier with respect to the lead wire array.

3. The combination according to claim 2 further comprising means for aligning a heat sink for attachment to the leadless chip carrier.

4. A method of mounting and electrically interconnecting a leadless chip carrier to a printed wiring board. the leadless chip carrier having a plurality of contact pads in a regular array along the edges of a major surface and the printed wiring board having a corresponding array of contact pads on a major surface. the method comprising the steps of:
   providing a length of bare wire;
   forming said length of wire into a planar serpentine shape having a plurality of parallel segments each connected by reversing segments at its ends to the next adjacent parallel segments on either side. the spacing of said parallel segments corresponding to the spacing of said contact pads;
   folding said formed wire about a line orthogonal to said parallel segments so that first portions of said parallel segments and the reversing segments at a first end adjacent to said first portions of said parallel segments lie in a first plane and second portions of said parallel segments and the reversing segments at the second end adjacent to said second portions of said parallel segments lie in a second plane which is substantially parallel to and spaced from said first plane;
   attaching said first portions of said parallel segments in said first plane to respective contact pads on said leadless chip carrier;
   removing the reversing segments in said first plane from said first portions of said parallel segments;
   removing the reversing segments in said second plane from said second portions of said parallel segments; and
   attaching said second portions of said parallel segments in said second plane to respective contact pads on said printed wiring board.

5. The method according to claim 1 further including the step of flattening said first and second portions of said parallel segments prior to the step of folding.

6. The method according to claim 5 further including the step of forming frangible regions of said wire at the junctures of said reversing segments with said first and second portions prior to the step of folding.

7. The method according to claim 1 wherein the reversing segments are C-shaped.

8. The method according to claim 1 wherein the step of folding includes forming a C-shaped bend.

9. The method according to claim 1 wherein the step of folding includes two oppositely directed bending steps to form a Z-shaped bend.

10. The method according to claim 1 further including. after the step of folding. the steps of:
    providing a carrier board having an array of posts corresponding to the positions of the reversing segments of the folded formed wire; and
    installing the folded formed wire on the carrier board with the reversing segments wrapped around respective ones of the posts.

* * * * *

UNITED STATES PATENT AND TRADEMARK OFFICE
CERTIFICATE OF CORRECTION

PATENT NO. : 5,177,326
DATED : January 5, 1993
INVENTOR(S) : Kurt R. Goldhammer

It is certified that error appears in the above-indentified patent and that said Letters Patent is hereby corrected as shown below:

```
Column 6, Claim 5, line 46, change "1" to -- 4--.
         Claim 7, line 53, change "1" to -- 4--.
         Claim 8, line 55, change "1" to -- 4--.
         Claim 9, line 57, change "1" to -- 4--.
         Claim 10, line 60, change "1" to --4--.
```

Signed and Sealed this

Nineteenth Day of October, 1993

Attest:

BRUCE LEHMAN

*Attesting Officer*     *Commissioner of Patents and Trademarks*